(12) United States Patent  (10) Patent No.: US 8,676,522 B2
Pearson  (45) Date of Patent: Mar. 18, 2014

(54) DETECTOR FOR DETECTING A CURRENT CARRYING CONDUCTOR

(75) Inventor: Richard David Pearson, Bristol (GB)

(73) Assignee: Radiodetection Limited, Bristol (GB)

( * ) Notice: Subject to any disclaimer, the term of this patent is extended or adjusted under 35 U.S.C. 154(b) by 360 days.

(21) Appl. No.: 12/961,399

(22) Filed: Dec. 6, 2010

(65) Prior Publication Data

US 2012/0143532 A1    Jun. 7, 2012

(51) Int. Cl.
G06F 19/00    (2011.01)

(52) U.S. Cl.
USPC ............ 702/57; 324/326; 324/67; 324/327; 324/335

(58) Field of Classification Search
USPC ........ 702/57; 324/326, 67, 66, 327, 328, 329, 324/335; 455/234, 239, 40; 340/551, 552, 340/567
See application file for complete search history.

(56) References Cited

U.S. PATENT DOCUMENTS

| 4,686,454 | A  | * | 8/1987 | Pecukonis ........................ 324/67 |
| 5,001,430 | A  | * | 3/1991 | Peterman et al. .............. 324/326 |
| 5,686,828 | A  | * | 11/1997 | Peterman et al. ............. 324/71.1 |
| 6,130,539 | A  | * | 10/2000 | Polak ............................. 324/326 |
| 6,268,731 | B1 |   | 7/2001 | Hopwood et al. |
| 6,407,550 | B1 | * | 6/2002 | Parakulam et al. ........... 324/326 |
| 6,642,796 | B2 |   | 11/2003 | Royle |
| 6,777,923 | B2 | * | 8/2004 | Pearson ........................ 324/127 |
| 6,968,296 | B2 |   | 11/2005 | Ruhe et al. |
| 7,342,537 | B2 | * | 3/2008 | Pearson et al. ................ 342/459 |
| 7,385,406 | B1 | * | 6/2008 | Blades .......................... 324/713 |
| 7,403,012 | B2 |   | 7/2008 | Worsley et al. |
| 8,209,136 | B2 | * | 6/2012 | Li .................................. 702/38 |
| 2012/0232837 | A1 | * | 9/2012 | Li ................................. 702/150 |

FOREIGN PATENT DOCUMENTS

WO    95/30913 A1    11/1995
WO    98/40764 A1    9/1998

* cited by examiner

*Primary Examiner* — Carol S Tsai
(74) *Attorney, Agent, or Firm* — Baker & Hostetler LLP

(57) ABSTRACT

A locator for locating a concealed conductor comprises a first field detector operable to detect an alternating magnetic field along a first axis parallel to a primary axis of the locator; a second field detector, displaced from the first field detector and operable to detect an alternating magnetic field along a second axis parallel to the primary axis of the locator; and a processor operable to calculate a difference between a field detected by the first detector and a field detected by the second detector, and to calculate an indication of the lateral displacement of the concealed conductor from the primary axis of the locator using the difference.

11 Claims, 15 Drawing Sheets

DETECTOR FOR DETECTING A CURRENT CARRYING CONDUCTOR

FIELD OF THE INVENTION

The present invention relates to a detector for locating a concealed conductor.

BACKGROUND OF THE INVENTION

Before commencing excavation or other work where electrical cables, fiber optic cables or other utilities ducts or pipes are buried, it is important to determine the location of such buried cables or pipes to ensure that they are not damaged during the work. Once a buried utility is located the depth of the utility can be calculated to determine a safe excavation depth.

Current carrying conductors emit electromagnetic radiation which can be detected by an electrical antenna. If fiber optic cables or non-metallic utilities ducts or pipes are fitted with a small electrical tracer line, an alternating electrical current can be coupled into the tracer line which in turn radiates electromagnetic radiation. It is known to use detectors to detect the electromagnetic field emitted by conductors carrying alternating current.

One type of such detector works in one of two modes, namely 'active' or 'passive' modes. Each mode has its own frequency bands of detection.

The passive mode comprises 'power' mode and 'radio' mode. In power mode, the detector detects the magnetic field produced by a conductor carrying an AC mains power supply at 50/60 Hz, or the magnetic field re-radiated from a conductor as a result of a nearby cable carrying AC power, together with higher harmonics up to about 5 KHz. In radio mode, the detector detects very low frequency (VLF) radio energy which is re-radiated by buried conductors. The source of the original VLF radio signals is a plurality of VLF long wave transmitters, both commercial and military.

In the active mode, a signal transmitter produces an alternating current of known frequency and modulation, which couples a signal current into a nearby buried conductor. The signal transmitter may be directly connected to the conductor or, where direct connection access is not possible, a signal transmitter may be placed near to the buried conductor and a signal current may be induced in the conductor. The buried conductor re-radiates the signal produced by the signal transmitter.

This invention provides further advancements to existing systems for locating concealed current carrying conductors, providing additional functionality and benefits to the user.

SUMMARY OF THE INVENTION

According to an embodiment of the invention there is provided a locator for locating a concealed conductor. The locator comprises a first field detector operable to detect an alternating magnetic field along a first axis parallel to a primary axis of the locator; a second field detector, displaced from the first field detector and operable to detect an alternating magnetic field along a second axis parallel to the primary axis of the locator; and a processor operable to calculate a difference between a field detected by the first detector and a field detected by the second detector, and to calculate an indication of the lateral displacement of the concealed conductor from the primary axis of the locator using the difference.

The locator may further comprise a reference field detector operable to detect an alternating magnetic field along an axis orthogonal to the primary axis of the locator.

The processor may calculate the difference including a phase and determine a lateral direction to the conductor by comparing the phase of the difference with the phase of the field detected by the reference field detector.

The processor may be operable to calculate the indication of the lateral displacement from the product of the magnitude of the difference with a reciprocal of a measure of the magnetic field at the locator.

The measure of the magnitude at the locator may be the magnitude of the magnetic field as measured by the reference field detector.

According to another embodiment of the present invention there is provided a method of locating a concealed conductor. The method comprises detecting a first alternating magnetic field, at a first location, along a first axis; detecting a second alternating magnetic field, at a second location displaced from the first location, along a second axis parallel to the first axis; calculating a difference between the first magnetic field and the second magnetic field; and calculating an indication of the lateral displacement of the concealed conductor from a primary axis parallel to the first axis and the second axis.

According to one embodiment of the present invention the method further comprises detecting a reference alternating magnetic field along a reference axis orthogonal to the primary axis.

According to one embodiment of the present invention the method comparing the phase of the reference magnetic field with the phase of the difference between the first magnetic field and the second magnetic field and determining a lateral direction to the concealed conductor from the result of the comparison.

According to one embodiment of the present invention the method adjusting the lateral indication using a value derived from the reference magnetic field.

According to a further embodiment of the present invention, there is provided a carrier medium carrying computer readable instructions for execution by a processor in a locator for locating a concealed conductor having a first field detector operable to detect an alternating magnetic field along a first axis parallel to a primary axis of the locator, and a second field detector, displaced from the first field detector and operable to detect an alternating magnetic field along a second axis parallel to the primary axis of the locator; wherein the instructions comprise instructions for controlling the processor to calculate a difference between the first magnetic field and the second magnetic field; and calculate an indication of the lateral displacement of the concealed conductor from a primary axis parallel to the first axis and the second axis.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
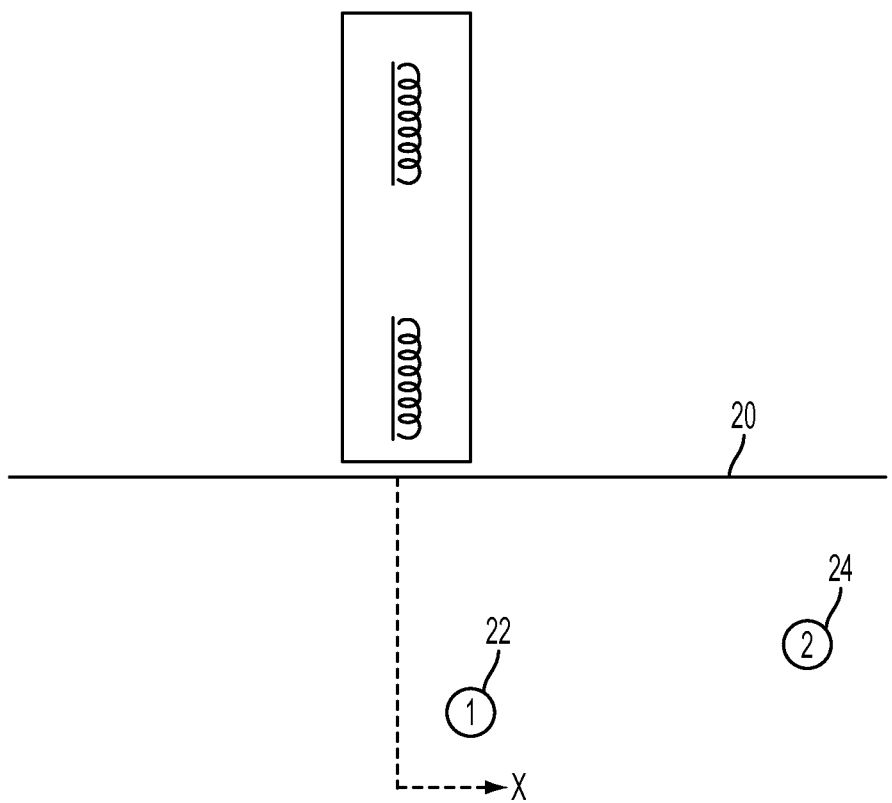
FIG. 1 shows a schematic view of a locator for locating concealed conductors according to an embodiment of the present invention.

The invention will now be described with reference to the drawing figures, in which like reference numerals refer to like parts throughout.

FIG. 1 shows a schematic view of a locator 10 for locating concealed conductors according to an embodiment of the present invention. FIG. 1 shows the ground level 20 and a target conductor 22 buried beneath the ground. There is a further conductor 24 buried beneath the ground. Both conductors 22 and 24 carry an alternating current and therefore emit a magnetic field. There may be coupling between the conductors 22 and 24 for example resistive coupling which would result in the alternating currents in the two conductors being in phase. The locator 10 has a bottom vertical magnetic field sensor $V_b$ and a top vertical magnetic field sensor $V_t$. The magnetic field sensors $V_b$ and $V_t$ are located vertically above one another. The magnetic field sensors $V_b$ and $V_t$ are both operable to detect magnetic fields along the primary vertical axis of the locator.

The inclusion of two vertical magnetic field sensors in the locator 10 allows the lateral distance between the locator 10 and the target conductor 22 to be more accurately calculated in the presence of a second conductor 24 than would be the case for a locator having a single vertical magnetic field sensor. The reasons for this are described below with reference to FIGS. 2 to 4.

Figure 2:
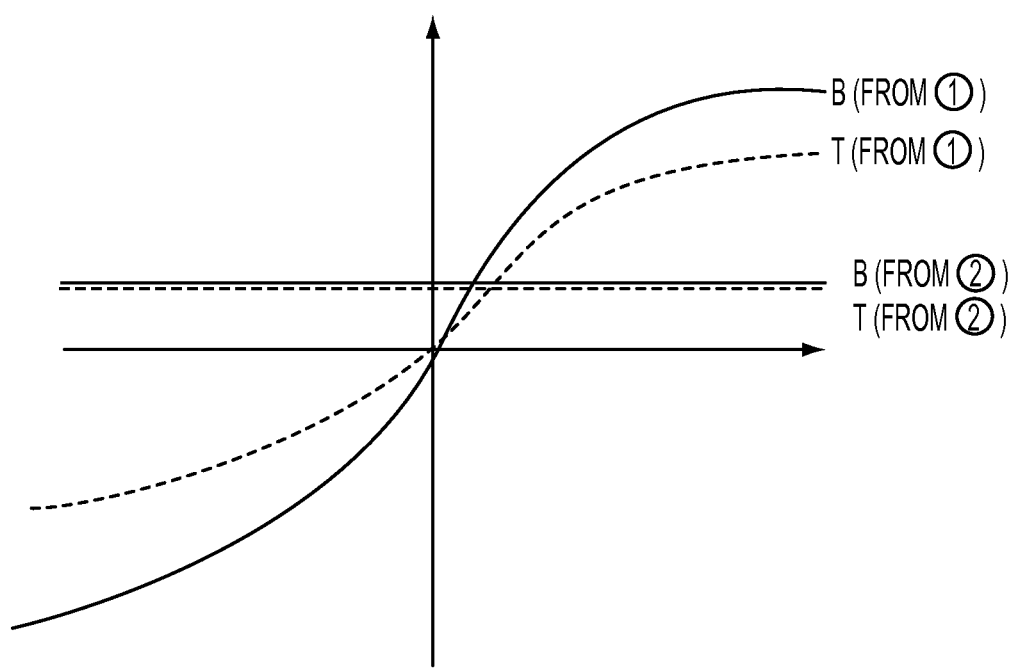
FIG. 2 shows a graph of the magnetic field amplitude and polarity detected by the locator shown in FIG. 1.

FIG. 2 shows a graph of the magnetic field amplitude and polarity detected at $V_b$ and $V_t$ from the target conductor 22 and the second conductor 24. Because the second conductor 24 is located relatively far from the locator 10 in comparison to the distance from the second conductor 24, it is assumed that the magnetic field will not vary greatly with lateral movements of the locator in the direction indicated as x on FIG. 1. The amplitude of the magnetic field due to the target conductor, measured at the top sensor $V_t$ is zero when the locator is located directly above the target conductor 22 as at this point the magnetic field is perpendicular to the sensor. As the lateral distance between the locator and the target conductor 22 increases, as does the measured field amplitude this is because the component of the field in the vertical direction increases. When the locator is passed over the position of the target conductor 22, the polarity of the field reverses. The shape of the curve of the magnetic field measured in the top vertical field detector $V_t$ is similar to that of that measured by the bottom vertical field sensor $V_b$ however, the strength of the field measured is lower as the distance between the target conductor 22 and the top vertical magnetic field sensor Vt is greater than the distance between the target conductor 22 and the bottom magnetic field sensor $V_b$.

Figure 3:
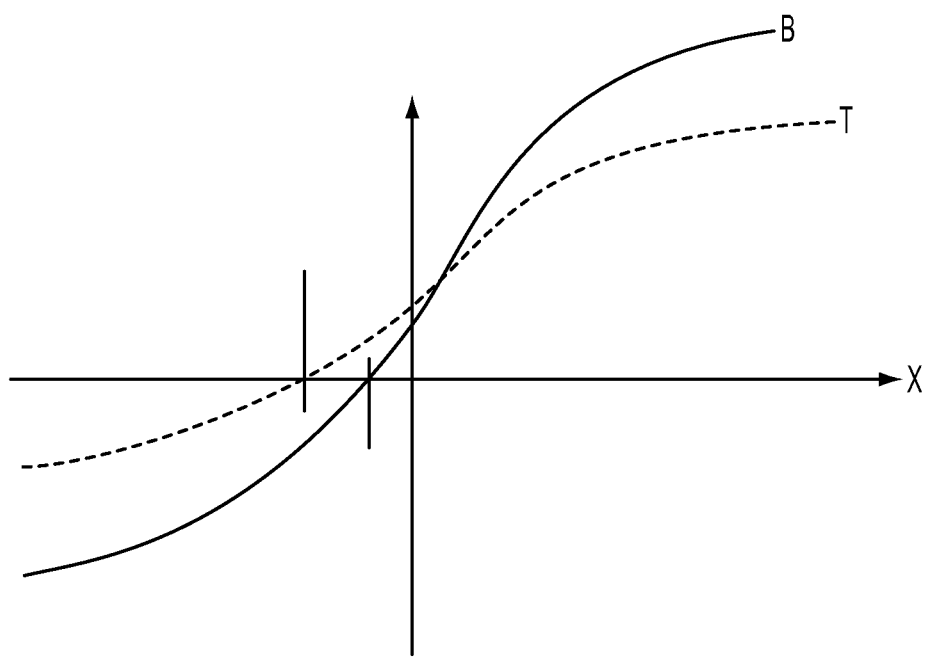
FIG. 3 shows a graph of the magnetic field amplitude and polarity detected by the locator shown in FIG. 1.

FIG. 3 shows the magnetic field measured at $V_t$ and $V_b$. This is the sum of the fields produced by the target conductor 22 and the second conductor 24. As can be seen in FIG. 3, the presence of the second conductor causes the zero, or null, of the measured magnetic field to be located at a position displaced from the true position of the target conductor. This means that systems using a single vertical coil to determine the lateral location of a target conductor are susceptible to interference from the presence of second additional conductors underground.

Embodiments of the present invention reduce this effect by using the difference between the field measured at the bottom vertical magnetic field sensor and the top vertical magnetic field sensor when calculating the lateral distance between the locator and the target conductor.

Figure 4:
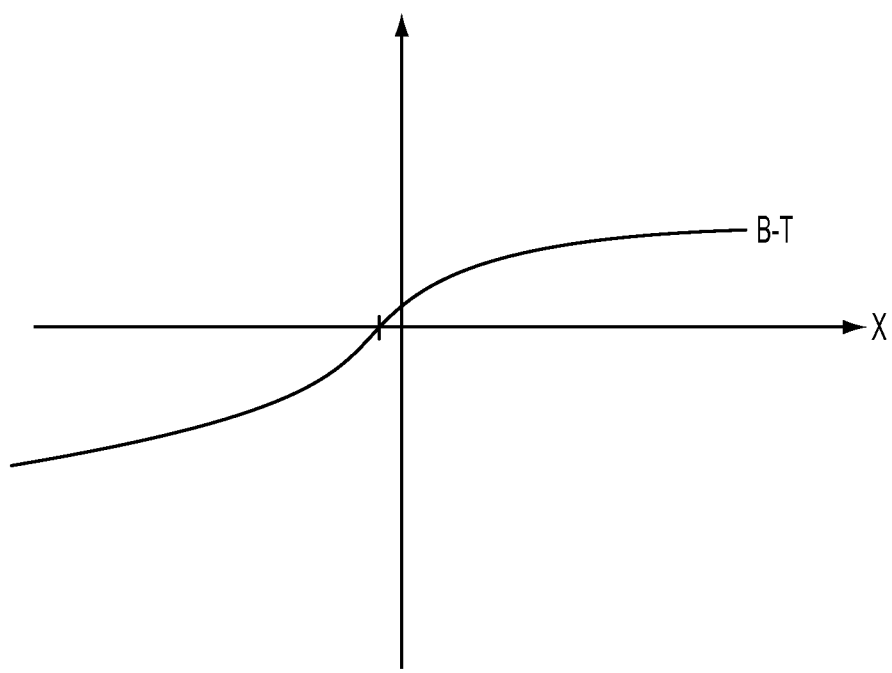
FIG. 4 shows a graph of the difference between the field measured at the bottom vertical magnetic field detector and the field measured at the top vertical magnetic field sensor of the locator shown in FIG. 1.

FIG. 4 shows a graph of the difference between the field measured at the bottom vertical magnetic field detector $V_b$ and the field measured at the top vertical magnetic field sensor $V_t$. As is apparent from FIG. 4, the use of this difference in place of either of the signals measured at either the top vertical or the bottom vertical magnetic field sensors reduces the displacement of the null and therefore allows the lateral displacement from the locator to the target conductor to be more accurately calculated.

The use of two vertical coils $V_b$ and $V_t$ means that common-mode signals from second conductors located far from the target conductor are rejected. This allows more accurate location of concealed conductors.

The above FIGS. 1 to 4 illustrate magnetic field as a signed amplitude with the polarity changing as the locator is moved from right to left. When single-frequency alternating magnetic fields are measured, it is only possible to measure signal-polarity with respect to another signal. Therefore if two coils are used, as is shown in FIG. 1, the magnitude of the magnetic field can be measured but as the polarity of all of the signals changes, it is not possible to determine an indication of the polarity of the magnetic field since a reference polarity would be required to compare the signals measured at the left hand side and the right hand side of the null in order to determine whether the locator was located to the left or to the right of the null position.

Figure 5:
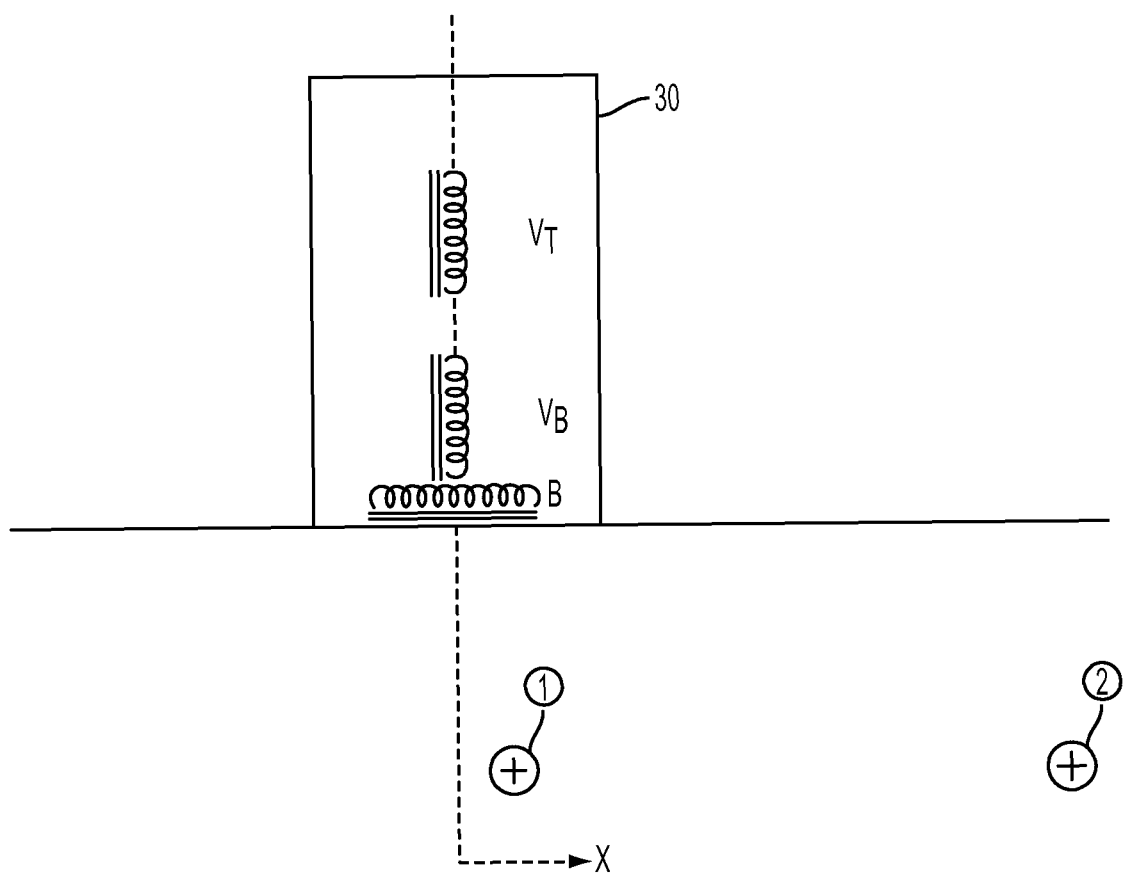
FIG. 5 shows a schematic view of a locator according to an embodiment of the present invention.

FIG. 5 shows a schematic view of a locator 30 according to an embodiment of the present invention. The locator 30 has a top vertical coil $V_t$ and a bottom vertical coil $V_b$ as was the case with the locator 10 shown in FIG. 1. The locator 30 includes an additional bottom horizontal coil B that is arranged perpendicular to the axis of the vertical coils $V_t$ and $V_b$.

Figure 6:
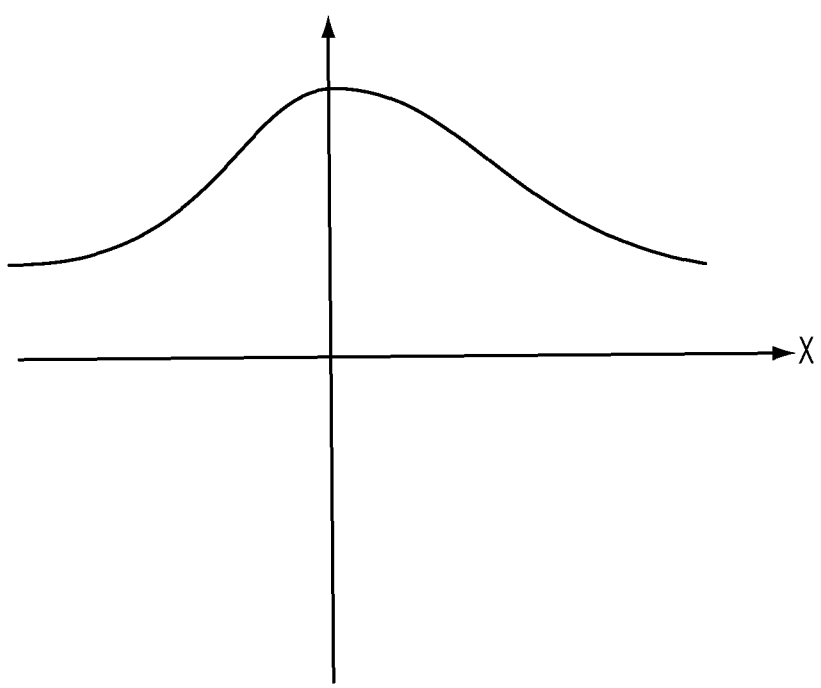
FIG. 6 shows the magnetic field amplitude detected by a sensor in the locator shown in FIG. 5.

The field detected by the detector B with respect to distance x from the concealed conductor 22 is shown in FIG. 6. The response of the detector B to the magnetic field exhibits a bell shape having a peak response when directly above the target conductor. It is noted that there is no change of polarity when detector B passes over the concealed conductor.

Because there is no change in polarity of the signal received by the bottom horizontal detector B, it is possible to use the output of detector B as a reference to determine the polarity of the difference signal between the $V_b$ and $V_t$. Information on the polarity of the difference signals allows a determination of whether the locator is to the left or to the right of the concealed conductor to be determined.

Further, the output from the horizontal coil B can be used to normalize the difference value meaning that an indication signal representing the lateral distance from the locator to the concealed conductor can be calculated such that the indication signal is invariant with the magnitude of the signal current in the concealed conductor. This function makes embodiments of the present invention particularly easy to use because a user does not have to adjust the gain of the system to account for variations in soil type and strength of the signal in the concealed conductors.

Figure 7:
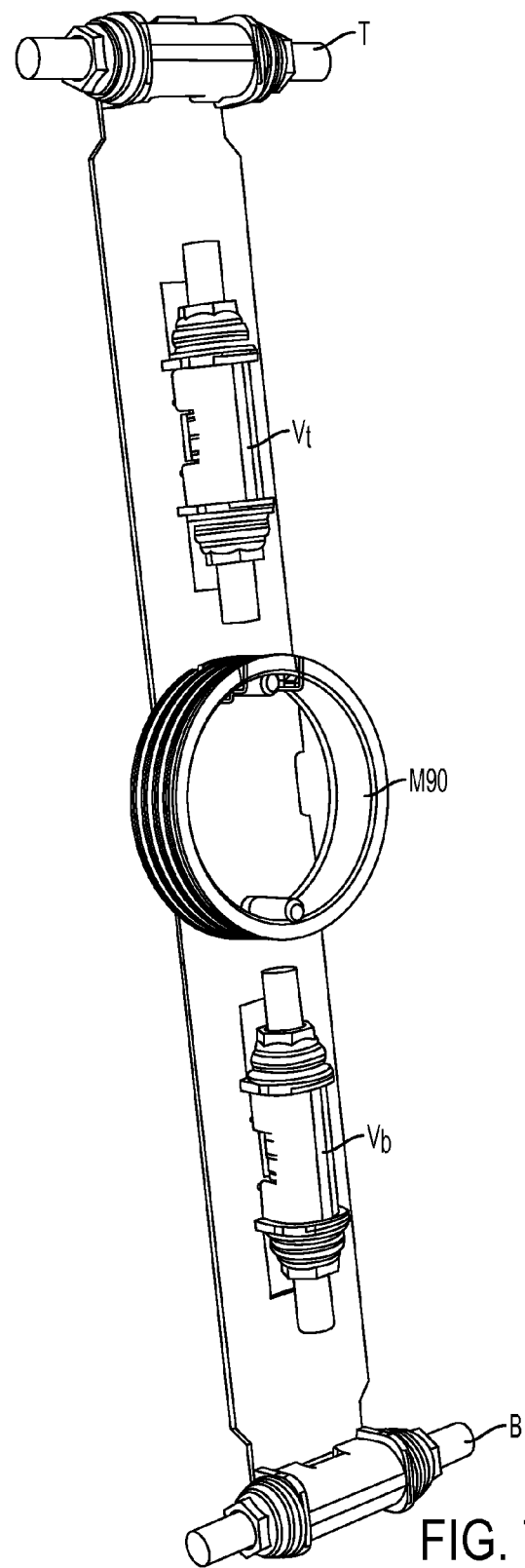
FIG. 7 shows an array of magnetic field detectors for use in a locator according to an embodiment of the present invention.

FIG. 7 shows an array of magnetic field detectors for use in a locator according to an embodiment of the present invention. The array has five magnetic field detectors arranged in a line. At the top there is a top horizontal field detector. Below the top horizontal field detector is a top vertical field detector $V_t$. Below the top vertical field detector $V_t$ is a horizontal field detector oriented in a plane orthogonal to the top horizontal field detector M90. Below the M90 field detector there is a second vertical field detector $V_b$. At the bottom of the array there is a second horizontal field detector B. The top and bottom horizontal field detectors and the vertical field detectors have ferrite cores. The M90 coil is an air-cored coil. This means that the protrusion of the M90 coil out of the plane of the array is minimized, allowing the array to be supported and protected inside a compact blade-shaped housing. An example of such a coil array is described in more detail in U.S. Pat. No. 6,268,731, the content of which is incorporated herein by reference in its entirety.

Figure 8A:
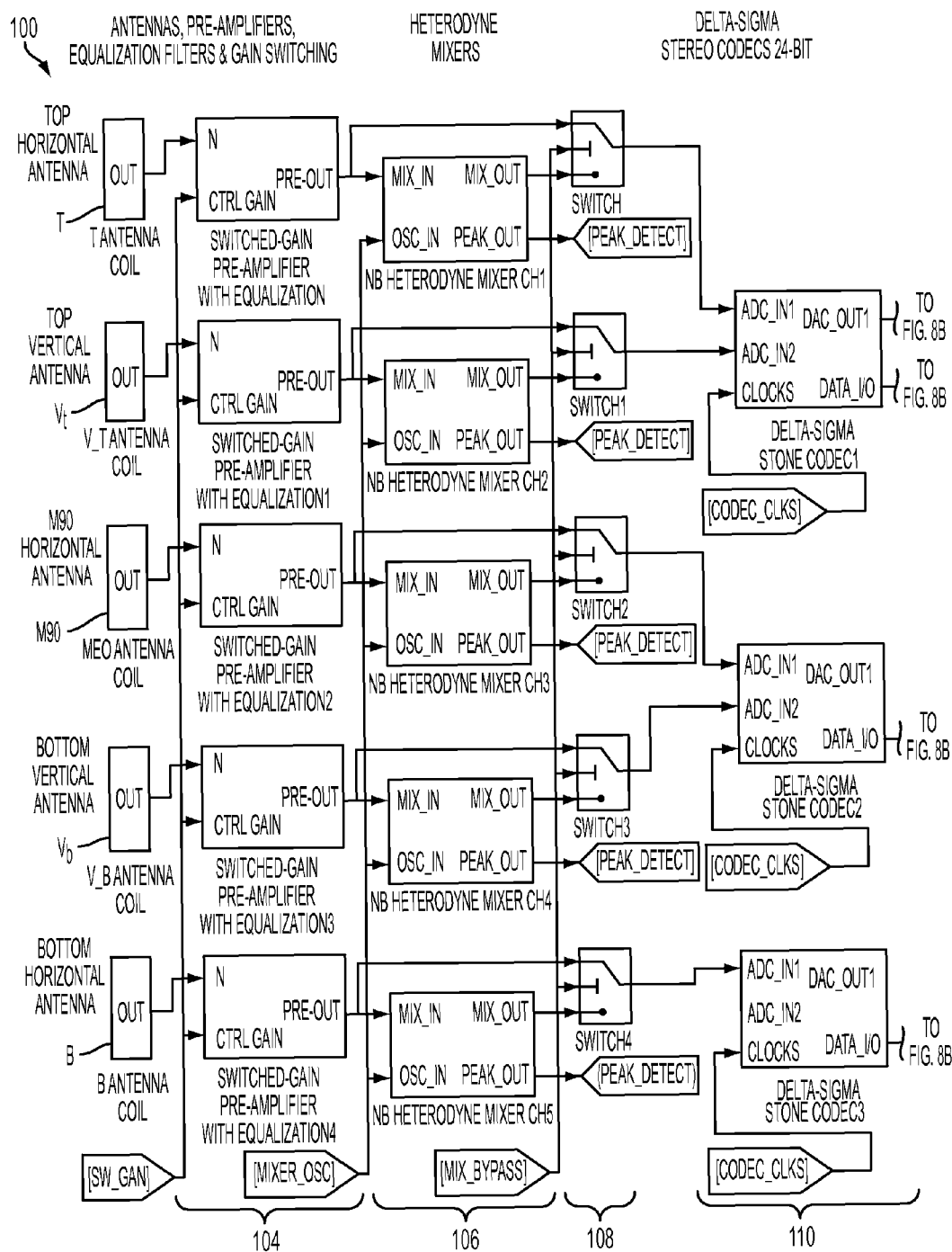
FIG. 8 shows a block diagram of a locator according to an embodiment of the present invention.
Figure 8B:
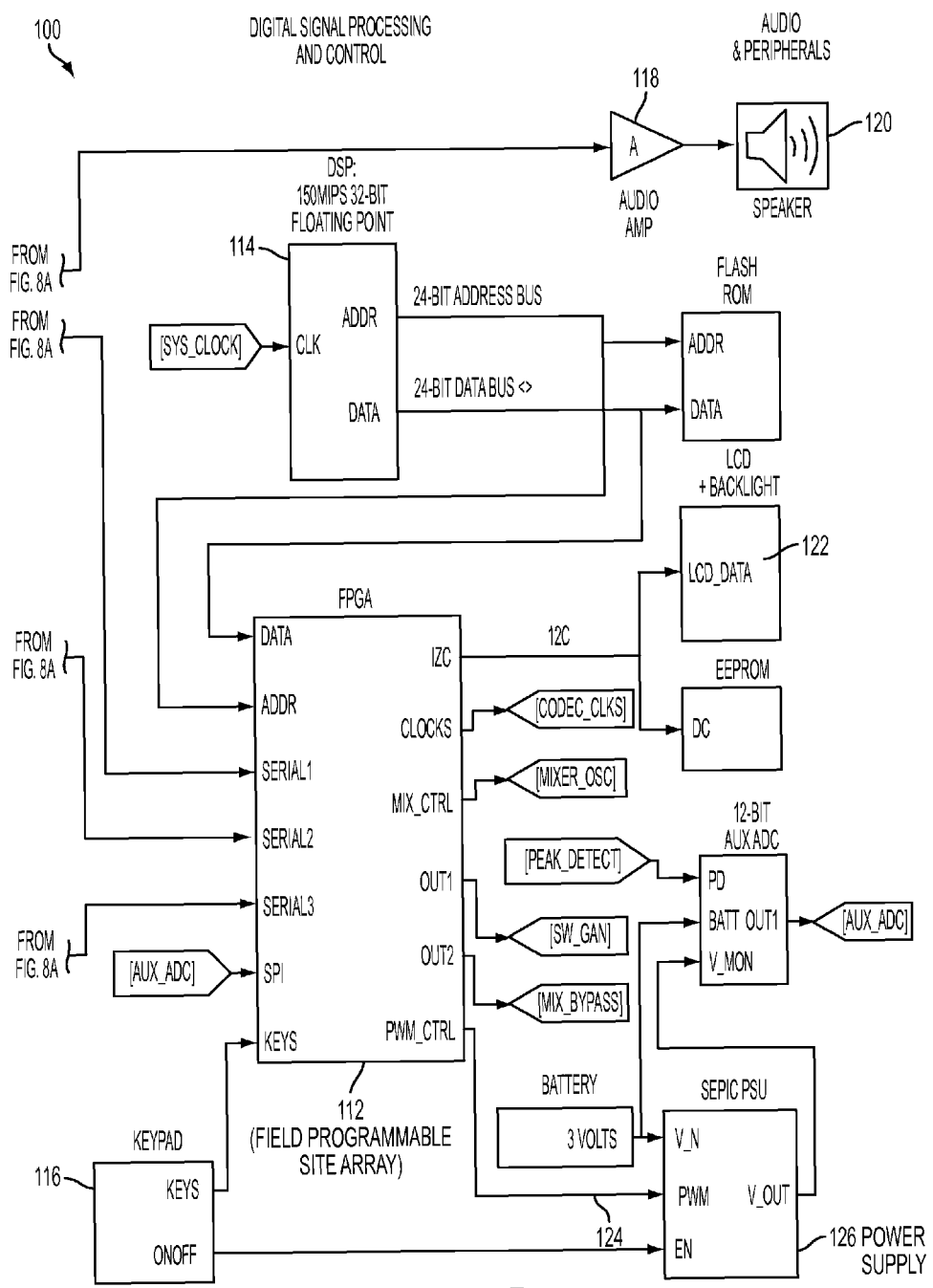

FIG. 8 shows a block diagram of a locator 100 according to an embodiment of the present invention. The magnetic field detectors described in relation to FIG. 7 provide the inputs to the signal processing shown in FIG. 8. The analogue signals from the antennas are fed into switched gain pre-amplifiers 104. The outputs of the pre-amplifiers 104 are then optionally processed by narrow-band heterodyne mixers 106 which down-convert the signals to a lower intermediate frequency that is within the sampling range of the ADCs in delta sigma stereo CODECs 110. Delta sigma stereo CODECs 110 convert the analogue signals into digital signals. Switches 108 select the analogue signals to be routed to delta sigma stereo CODECs 110 either directly or via narrow-band heterodyne mixers 106. The digital signal outputs from the delta sigma CODECs 110 are received by field programmable gate array 112. This buffers the digital signals allowing them to be read by digital signal processor 114. The operation of the locator 100 can be controlled by a user using keypad 116. The locator can provide audible indications to a user by converting a digital signal produced by DSP 114 to an analogue audio signal in CODEC 110, amplifying this by means of amplifier 118 connected to a speaker 120. The locator can also provide indications to a user using display 122. The locator is powered by battery 124 which is connected to power supply 126. Power supply 126 can provide the voltages required by the components of the locator 100. Spectral artifacts produced by the PWM process can be radiated by components of power supply 126. If not carefully managed, these spectral components can appear within the bandwidth of detection of the field detectors and filtering resulting in interference. Such interference is prevented by the managed power supply system described in more detail in U.S. Pat. No. 7,403,012, the content of which is incorporated herein by reference in its entirety.

In use, the signals from the antenna coils T, Vt, M90, $V_b$ and B are amplified by preamplifier stage 104, optionally frequency-shifted by narrow band heterodyne mixers 106 and converted into digital signals by delta sigma CODECs 110. On the basis of these signals, digital processor 114 performs calculations on the signals and calculates the distances and orientations of concealed conductors. DSP 114 controls via field programmable gate array 112 the signal sent to speaker 120 and display 122 to provide a user with audible and visual indications of the location of the concealed conductor.

Figure 9:
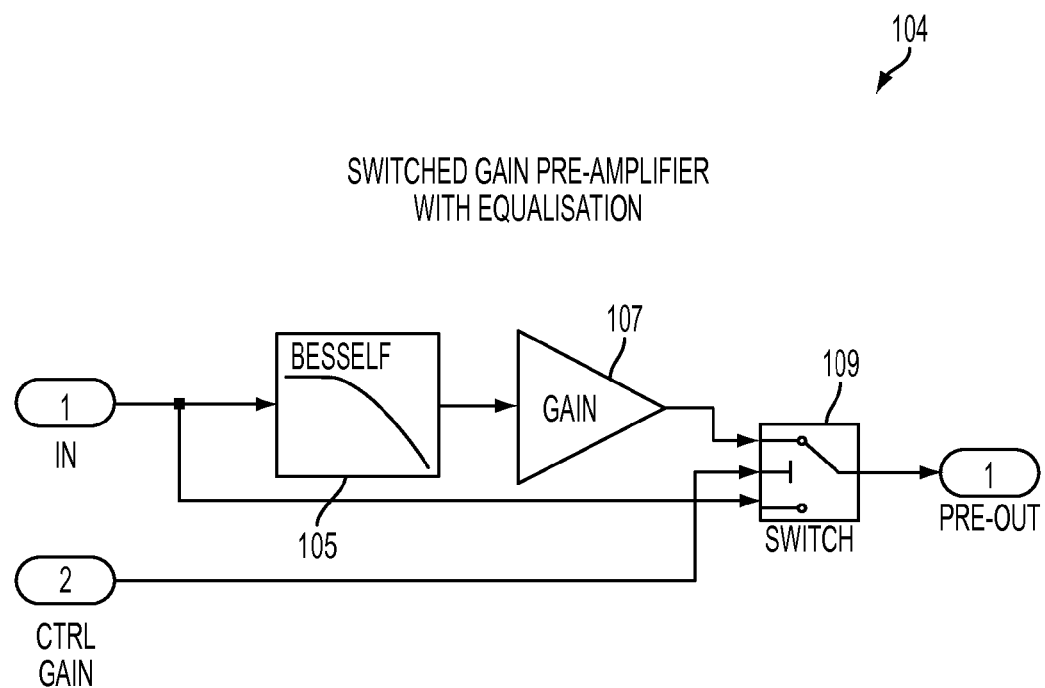
FIG. 9 shows the preamplifier stage of the locator shown in FIG. 8.

FIG. 9 shows the preamplifier stage 104 in more detail. If the signal detected by antennas is weak, the analogue output IN from each of the antennas is fed through an equalization filter 105 and amplified by amplifier 107; otherwise the outputs from the antennas are fed directly into the next stage of the circuit. Switch 109 selects whether the signals are amplified according to control signal CTRL GAIN.

Figure 10:
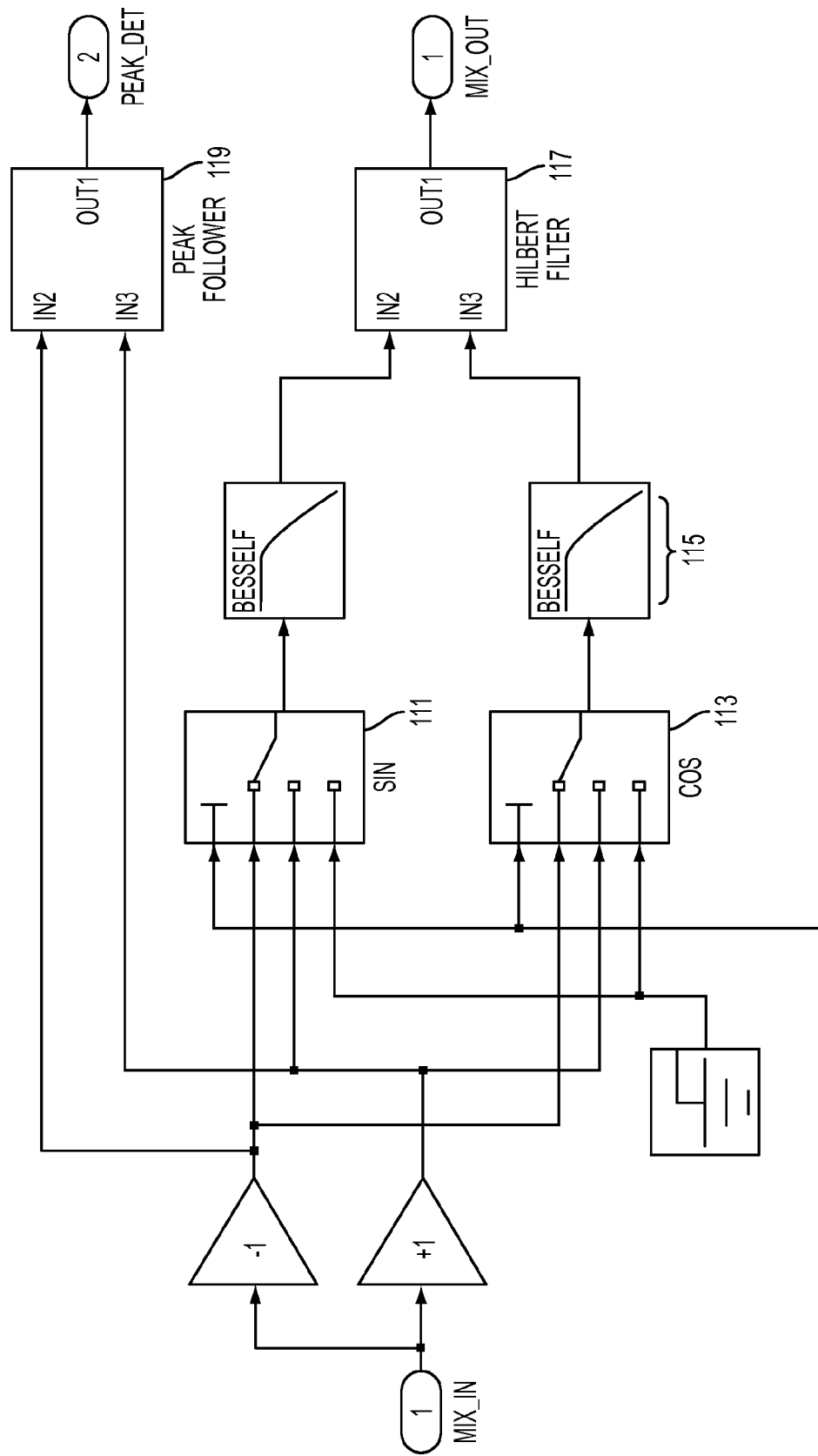
FIG. 10 shows the heterodyne mixers of the locator shown in FIG. 8.

FIG. 10 shows the heterodyne mixers 106 in more detail. The heterodyne mixers 106 act to frequency shift the incoming signals. This is achieved using cosine 113 and sine 111 operators and Hilbert filter 117. Peak follower 119 is used to manage switchable gain to increase the dynamic range of the system. Gain can be added in the analogue part of the signal processing and compensated for later in the digital signal processing.

Figure 11:
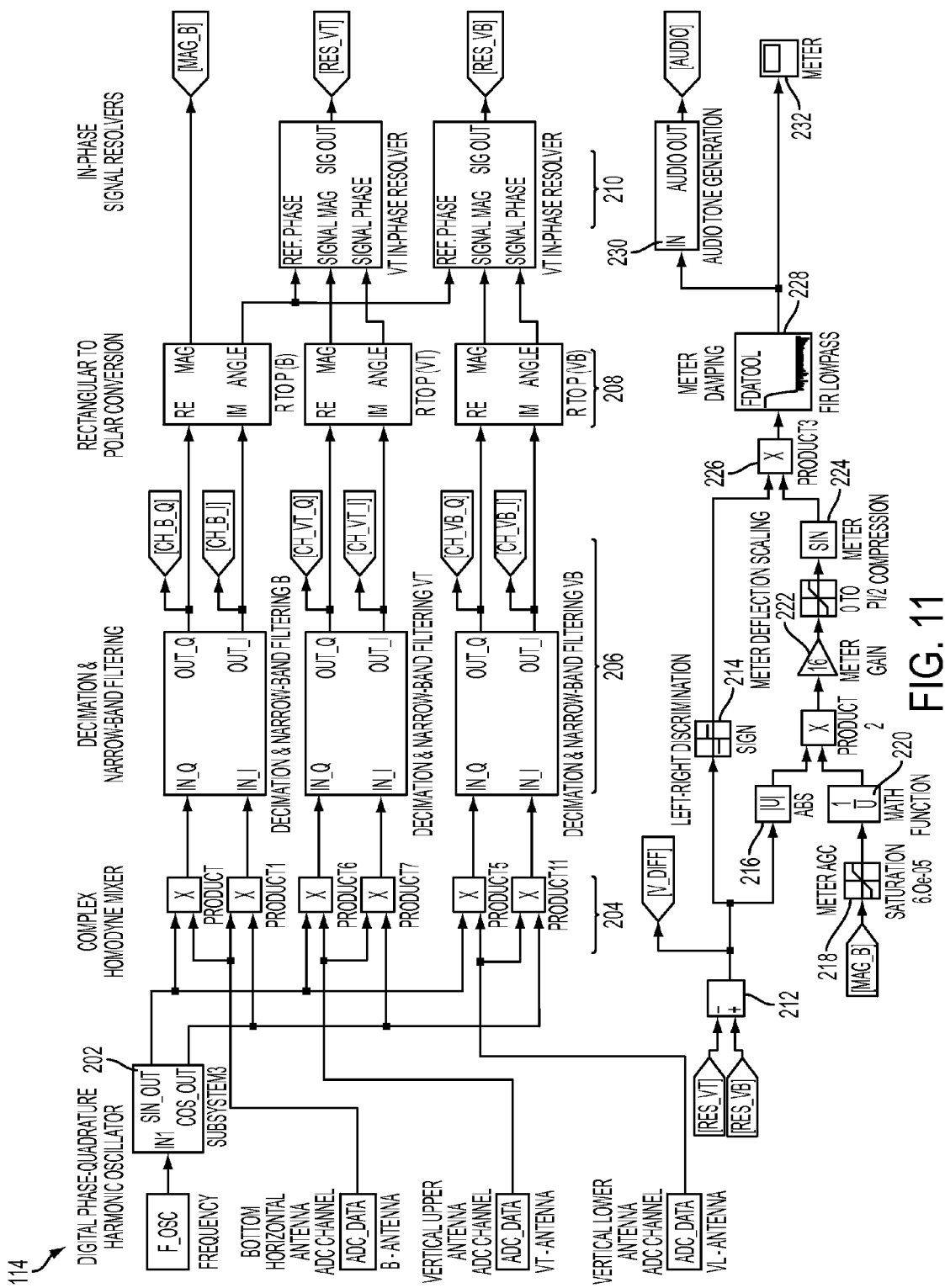
FIG. 11 shows the digital signal processing architecture that is implemented in digital signal processor in an embodiment of the present invention.

FIG. 11 shows the digital signal processing architecture that is implemented in digital signal processor 114 to calculate a left-right indication for a hidden conductor. The inputs to the system are the output digital signals from the delta sigma stereo CODECs 110 shown in FIG. 8. The inputs are three channels, one from the bottom horizontal antenna B and one from the vertical upper antenna channel VT and one from the vertical lower antenna channel VL. A digital phase quadrature harmonic oscillator 202 is implemented within the digital signal processing architecture. The digital phase quadrature harmonic oscillator 202 outputs a sine signal and a cosine signal. The digital phase quadrature harmonic oscillator may generate iterations of sine and cosine values and use the values calculated in previous iterations as negative feedback terms in synthesizing the next sine and cosine values. Such a digital phase quadrature oscillator is described in U.S. Pat. No. 6,642,796, the content of which is incorporated herein by reference in its entirety. The sine and cosine signals are multiplied by the input channels from the antenna in complex homodyne mixer 204.

The complex homodyne mixer multiplies the sampled input signal by sampled sine and cosine functions produced by the digital phase quadrature oscillator 202. The resulting in-phase (I) and phase-quadrature (Q) signals are each low-pass filtered to remove the sum components and unwanted noise received by the field detectors, to extract the wanted transmitter signal received from the concealed conductor. Filtering the I and Q sub-channel signals is accomplished by means of convolved sin c decimators 207 and 209 to effect down-sampling, followed by narrow-bandwidth FIR low-pass filters 211. Such a convolved sin c decimator is described in U.S. Pat. No. 6,968,296, the content of which is incorporated herein by reference in its entirety.

The filtered I and Q signal components constitute an analytic signal that encodes both the magnitude of the signal and its phase angle relative to that of the digital phase-quadrature oscillator 202. The magnitude and phase values are readily obtained from the filtered I and Q signal components by simple trigonometry. This task is accomplished by rectangle-to-polar conversion systems 208.

The phase angles of all the analytic signals in the system process at a common rate that depends on the difference between the frequency of the phase-quadrature oscillator 202 and the frequency of the signals received by the field detectors. There may be differences between the phase angles of the individual signals depending on the signals received by the field detectors. For example, when the bottom vertical coil traverses through the position of zero response above the concealed conductor the phase angle of its signal abruptly changes by $\pi$ radians (180 degrees).

If the bottom vertical field detector receives predominantly the signal from a second conductor, it is possible for this signal to be in phase-quadrature with respect to the signal received in the bottom horizontal field detector from the target conductor. This can occur where there is little or no conductive current path between the target and second conductors, where the signal current in the target conductor induces a secondary signal by electromagnetic induction due to their mutual inductance. Alternatively, if the conductors are in close proximity, for example in a conduit, there can be capacitive coupling of the signal current from the first conductor to the second conductor. In both cases the secondary current in the second conductor is $(\pi/2)$ radians (90 degrees) out of phase with respect to that in the target conductor. This phenomenon is known as signal bleedover.

If either or both vertical field detectors receive a bleedover signal from a second conductor, the vertical difference signal will fail to fall to zero as the locator traverses the target concealed conductor. It is therefore desirable to eliminate bleedover signals in the locator. The bottom horizontal field detector is coupled maximally to the concealed target cable and minimally to a second conductor.

A high degree of bleedover signal rejection in the locator is desirable. In a preferred embodiment this is achieved by resolving the signal components in each signal channel with respect to a reference signal that is in phase with the signal received from the concealed target conductor. The signal from the bottom horizontal field detector is minimally influenced by bleedover signals that are typical encountered, so this is the ideal signal reference.

The outputs from complex homodyne mixer 204 are then subjected to decimation and narrow-band filtering 206. The signals are then subjected to rectangular to polar conversion 208. The output of this step is an angle and a magnitude. ANGLE is the phase angle between the phase of the oscillator 202 and the phase of the inputs from the channels. If the frequency of the oscillator does not exactly match the frequency of the channels, the phase angle will rotate. In-phase signal resolvers 210 then determine the portion of the vertical upper and vertical lower antenna channels that is in phase with the horizontal bottom antenna channel. This means that the following calculations are made on the in-phase components of the vertical upper and lower antenna channels.

The difference between the in-phase components is calculated by subtractor 212. The result of the subtraction is the V_DIFF. This quantity is used for left-right discrimination and also to determine the lateral distance between the locator and the concealed conductor. Based on the sign of V_DIFF, left-right discrimination 214 determines whether the conductor is located to the left laterally or to the right laterally of the locator. The absolute value of V_DIFF is calculated in absolute value 216. The magnitude of the signal of the bottom horizontal antenna is used to normalize the absolute value of V_DIFF. MAG_B is subjected to saturation 218 to avoid divide-by-zero errors and then a reciprocal is calculated in 220. The reciprocal is multiplied by the absolute value of V_DIFF to give an adjusted deflection. This is then amplified in amplifier 222 and converted to a value between 0 and pi/2 before being subjected to meter compression 224. This result is then given a sign according to the result of the left-right discrimination 214 by product 226. Meter damping 228 then subjects the result to low pass filtering to remove any high frequency jitter. The output is then sent to audio tone generation 230 and meter 232.

Figure 12:
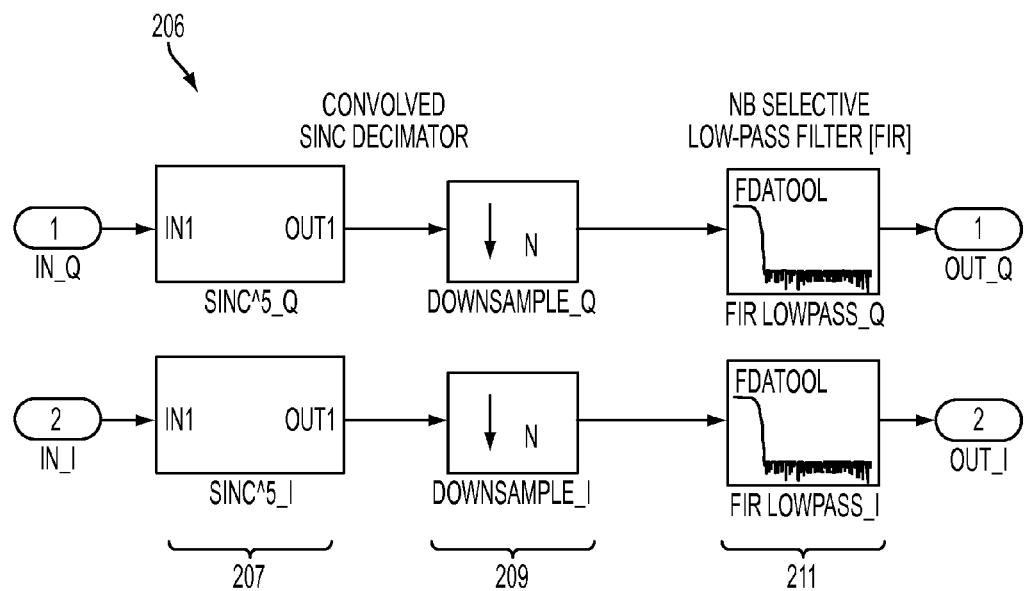
FIG. 12 shows the decimation and narrow band filtering stages of the digital signal processing architecture shown in FIG. 11.

FIG. 12 shows the decimation and narrow band filtering stages in more detail. The I and Q components are subjected to sin c decimation 207 and then down-sampled 209. The down-sampled signal is then subjected to low pass filtering 211.

Figure 13:
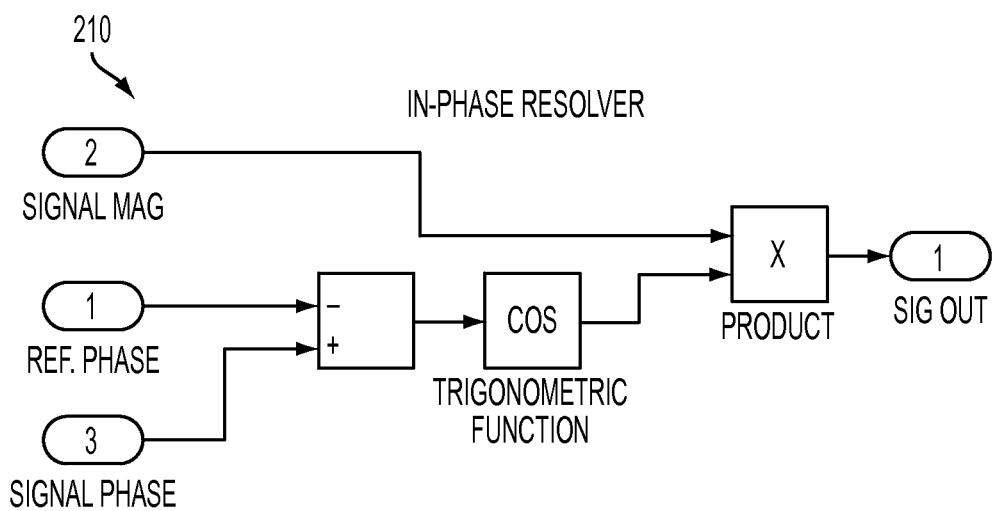
FIG. 13 shows an in-phase resolver of the digital signal processing architecture shown in FIG. 11.

FIG. 13 shows in-phase resolver 210 shown in FIG. 11 in more detail. The in-phase resolver 210 first calculates the phase difference between the signal phase input and the reference phase input. This represents the phase difference between the signal received by a field detector and the reference signal received by the bottom horizontal field detector. This phase difference is zero when these are fully in phase, and $(\pi/2)$ radians (90 degrees) out of phase corresponding to a pure bleedover signal being received. Multiplying the cosine of the phase difference by the magnitude of the input signal gives a signed signal amplitude value representing the input signal component resolved in phase with the reference signal. Therefore bleedover signals are rejected by the in-phase resolver 210.

The resulting signals, having been phase-referenced, contain only amplitude and polarity information. This simplifies the task of determining the lateral displacement of the locator from the concealed target conductor.

Figure 14:
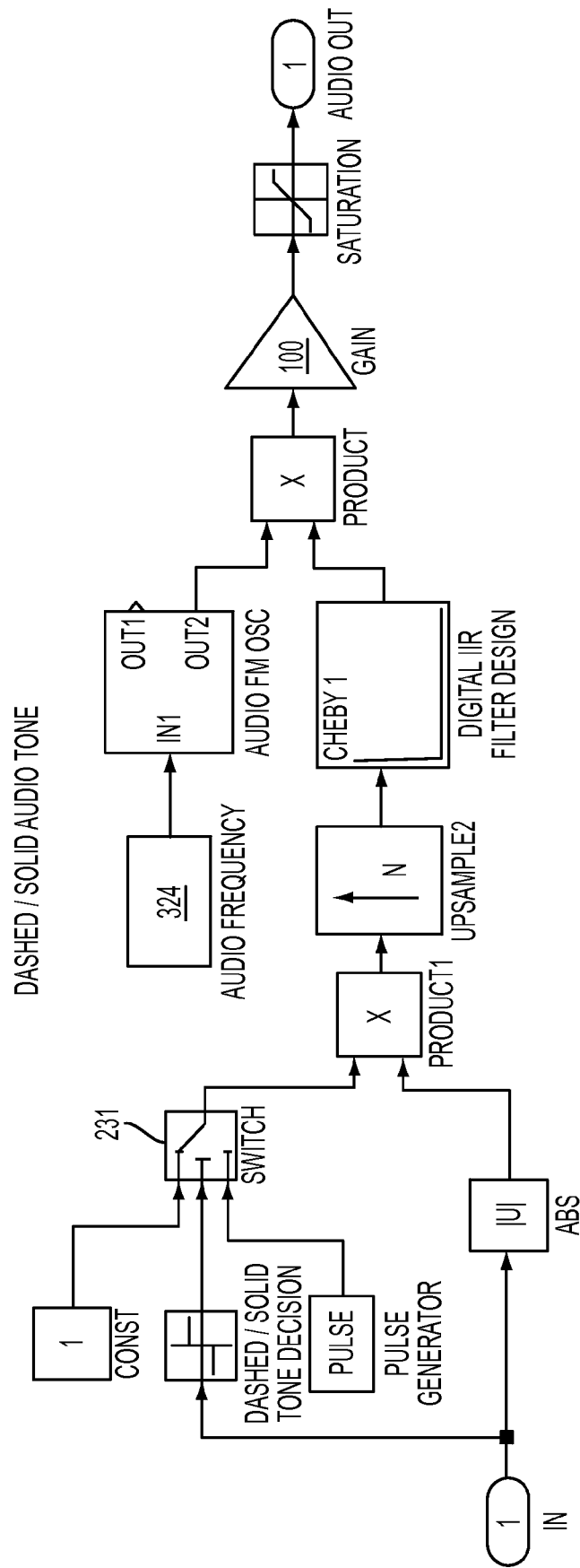
FIG. 14 shows the generation of the audio tone signals in the digital signal processing architecture shown in FIG. 11.

FIG. 14 shows the generation 230 of the audio tone signals in more detail. Switch 231 selects between the output of a pulse generator and a solid tone depending on the sign of the left/right discrimination signal. This signal is then multiplied by the absolute value of the output of meter damping 228. This signal is then up-sampled, digitally filtered and combined with an audio frequency signal. The audio out signal is either a constant tone or pulsed signal depending on whether the target conductor is located to the right or the left of the locator and the volume of the signal increases the further the locator is from the target conductor. This gives the user an audio indication of the location of the null field that would occur when the locator is located over a concealed conductor.

To aid location of the target conductor it is desirable to indicate to the operator the lay direction of the target conductor relative to the locator. An indication of the degree of rotation of the locator about its primary vertical axis relative to the axis of the target conductor may be calculated from the signals derived from the bottom horizontal field detector B and a mutually orthogonal field detector for example M90 in the arrangement shown in FIG. 7.

The angle subtended between the magnetic axis of the bottom horizontal field detector B and the axis of the target conductor may be determined by calculating the arctangent of the ratio of the magnitude of the bottom horizontal field detector B signal to the magnitude of the orthogonal horizontal field detector signal M90.

Alternatively, the angle subtended between the magnetic axis of the orthogonal horizontal field detector M90 and the axis of the target conductor may be determined by calculating the arctangent of the ratio of the magnitude of the orthogonal horizontal field detector signal M90 to the magnitude of the bottom horizontal field detector B signal.

In either arctangent calculation the magnitude may be replaced by the signed amplitude indicative of the relative polarity of the M90 signal to the B signal, in which case the 4-quadrant a tan 2 function returns the correct angle. If unsigned magnitudes are used the phase of the M90 signal relative to the B signal must be taken into account when determining in which quadrant the computed angle lies.

In an embodiment the resolved M90 signal component that is in phase with the reference B signal is used in the 4-quadrant arctangent calculation. This improves the accuracy of the angular indication in the presence of bleedover signals.

Various modifications will be apparent to those in the art and it is desired to include all such modifications as fall within the scope of the accompanying claims.

For example, possible embodiments are envisaged in which a phase locked loop is used to lock to the phase of the reference signal and provide phase synchronous sine and cosine oscillator signals to the complex homodyne mixer through which the signals derived from the other field detectors are demodulated. In such an embodiment, the phased locked loop comprises a phase detector and a variable frequency oscillator. The signal from the reference detector, for example the bottom horizontal field detector in a detector array, would be input into the phase detector of the phase locked loop. The phase locked loop compares the phase of the input signal with the phase of a signal derived from its oscillator and adjusts the frequency of its oscillator to keep the phases matched. A phase sensitive detector detects the component of the signals from the other coils that is in phase with the output of the phase locked loop. Because the phase locked loop is phase locked to the signal from the reference detector, the component of the signals that is in phase with the signal from the reference detector can be obtained in this way. Once the in-phase component has been calculated, the later signal processing can be implemented in an analogous manner to that described above.

The signal processing to arrive at the difference signal between the top and bottom vertical magnetic field sensors may be implemented a different order to that described above. For example, provided that phase and amplitude information of the difference signal are retained, the subtraction may be calculated before the in-phase components are determined.

The subtraction may be implemented as an analogue subtraction of the signals from $V_t$ and $V_b$, prior to digitization. This has the advantage of saving one ADC channel compared to the embodiment described in reference to FIGS. 8 to 14 above. If the subtraction is implemented on the analogue signals, calibration may require trimming during manufacture to correct for gain imbalances in the sensors and electronics, by adjusting the relative gains of the analogue signal paths carrying the $V_b$ and $V_t$ signals.

Further, the subtraction may be implemented in the digital domain in the processing before the in-phase component with respect to the signal from the reference magnetic field detector is calculated. For example, the subtraction may be implemented in the digital domain of the sampled-data signals from $V_t$ and $V_b$ following A/D conversion, prior to homodyne mixing. In a further possible implementation, the subtraction is carried out as a complex subtraction in the digital domain of the analytic signals deriving from the magnetic fields detected by $V_t$ and $V_b$ following homodyne mixing, either prior to decimation, or prior to narrow-band filtering, or following narrow-band filtering.

In all the above alternative embodiments the vertical difference signal is calculated prior to the in-phase resolving step. In these alternative embodiments, the in-phase resolving step calculates the signal component of the vertical difference signal that is in phase with the reference signal.

In embodiments where the subtraction is performed in the digital domain, digital gain may be readily applied to correct for gain imbalances in the sensors and electronics to calibrate the system. The required digital gain to calibrate the system can be determined during manufacture in a calibration process that can be automated.

The digital domain signal processing may be implemented in FPGA, DSP or microcontroller devices, or split across some combination of the aforementioned devices.

Aspects of the present invention can be implemented in any convenient form, for example using dedicated hardware, or a mixture of dedicated hardware and software for the processing of the signals. The processing apparatuses can comprise any suitably programmed apparatuses such as a general purpose computer, personal digital assistant, mobile telephone (such as a WAP or 3G-compliant phone) and so on. Since the processing of the present invention can be implemented as software, each and every aspect of the present invention thus encompasses computer software implementable on a programmable device. The computer software can be provided to the programmable device using any conventional carrier medium. The carrier medium can comprise a transient carrier medium such as an electrical, optical, microwave, acoustic or radio frequency signal carrying the computer code. An example of such a transient medium is a TCP/IP signal carrying computer code over an IP network, such as the Internet. The carrier medium can also comprise a storage medium for storing processor readable code such as a floppy disk, hard disk, CD ROM, magnetic tape device or solid state memory device.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A locator for locating a concealed conductor, comprising:
    a first field detector operable to detect an alternating magnetic field along a first axis parallel to a primary axis of the locator;
    a second field detector, displaced from the first field detector and operable to detect an alternating magnetic field along a second axis parallel to the primary axis of the locator;

a processor operable to calculate a difference between a field detected by the first detector and a field detected by the second detector, and to calculate an indication of the lateral displacement of the axis of the concealed conductor from the primary axis of the locator using the difference;

at least one of the first field detector and the second field detector being configured to detect a reference alternating magnetic field along a reference axis orthogonal to the primary axis; and the processor further configured to compare a phase of the reference magnetic field with a phase of the difference between the first magnetic field and the second magnetic field and determine a lateral direction to the concealed conductor from a result of the comparison, wherein the first axis and the second axis are coaxial with the primary axis.

2. The locator according to claim 1, further comprising a reference field detector operable to detect an alternating magnetic field along an axis orthogonal to the primary axis of the locator.

3. The locator according to claim 2, wherein the difference calculated by the processor includes a phase, and the processor is operable to determine a lateral direction to the conductor by comparing the phase of the difference with the phase of the field detected by the reference field detector.

4. The locator according to claim 2, wherein the processor is operable to calculate the indication of the lateral displacement from the product of the difference with a reciprocal of a measure of the magnetic field at the locator.

5. The locator according to claim 4, wherein the measure of the magnitude at the locator is the magnitude of the magnetic field measured by the reference field detector.

6. The locator according to claim 1, further comprising an indicator operable to provide an indication of the lateral displacement.

7. A method of locating a concealed conductor, comprising:
    detecting a first alternating magnetic field, at a first location, along a first axis;
    detecting a second alternating magnetic field, at a second location displaced from the first location, along a second axis parallel to the first axis;
    calculating a difference between the first magnetic field and the second magnetic field;
    calculating an indication of a lateral displacement of the concealed conductor from a primary axis parallel to the first axis and the second axis;
    detecting a reference alternating magnetic field along a reference axis orthogonal to the primary axis; and
    comparing a phase of the reference magnetic field with a phase of the difference between the first magnetic field and the second magnetic field and determining a lateral direction to the concealed conductor from a result of the comparison,
    wherein the first axis and the second axis are coaxial with the primary axis.

8. The method according to claim 7, further comprising adjusting the lateral indication using a value derived from the reference magnetic field.

9. A non-transitory non-volatile carrier medium containing computer instructions stored therein for causing a computer processor in a locator to perform locating a concealed conductor having a first field detector operable to detect an alternating magnetic field along a first axis parallel to a primary axis of the locator, and a second field detector, displaced from the first field detector and operable to detect an alternating magnetic field along a second axis parallel to the primary axis of the locator; the instructions comprising:
    instructions for controlling the processor to calculate a difference between the first magnetic field and the second magnetic field;
    instructions for calculating e an indication of a lateral displacement of the concealed conductor from a primary axis parallel to the first axis and the second axis; and
    instructions for controlling the processor to compare the phase of a reference magnetic field along a reference axis orthogonal to the primary axis with the phase of the difference between the first magnetic field and the second magnetic field, and to determine a lateral direction to the concealed conductor from the result of the comparison,
        wherein the first axis and the second axis are coaxial with the primary axis.

10. The carrier medium according to claim 9, wherein the instructions further comprise instructions for controlling the processor to adjust the lateral indication using a value derived from the reference magnetic field.

11. A method of locating a concealed conductor, comprising:
    detecting a first alternating magnetic field, at a first location, along a first axis;
    detecting a second alternating magnetic field, at a second location displaced from the first location, along a second axis parallel to the first axis;
    calculating a difference between the first magnetic field and the second magnetic field;
    calculating an indication of a lateral displacement of the concealed conductor from a primary axis parallel to the first axis and the second axis;
    detecting a reference alternating magnetic field along a reference axis orthogonal to the primary axis; and
    comparing a phase of the reference magnetic field with a phase of the difference between the first magnetic field and the second magnetic field and determining a lateral direction to the concealed conductor from a result of the comparison.

* * * * *